United States Patent [19]

Duley

[11] Patent Number: 5,546,297
[45] Date of Patent: Aug. 13, 1996

[54] APPARATUS FOR MODIFYING AN ELECTRICAL SIGNAL

[75] Inventor: Raymond S. Duley, Buda, Tex.

[73] Assignee: Advanced Micro Devices, Inc., Sunnyvale, Calif.

[21] Appl. No.: 459,539

[22] Filed: Jun. 2, 1995

Related U.S. Application Data

[63] Continuation of Ser. No. 114,469, Mar. 31, 1993, abandoned.

[51] Int. Cl.⁶ .................................................. H02M 3/06
[52] U.S. Cl. ................................................ 363/62; 327/565
[58] Field of Search ............................ 363/62; 323/282, 323/351, 271, 273; 395/750, 775; 327/565

[56] References Cited

U.S. PATENT DOCUMENTS

| | | | |
|---|---|---|---|
| 4,000,509 | 12/1976 | Jarvela | 357/81 |
| 4,107,555 | 8/1978 | Haas et al. | 307/308 |
| 5,034,568 | 7/1991 | Mather | 174/52.4 |
| 5,182,632 | 1/1993 | Bechtel et al. | 257/713 |

OTHER PUBLICATIONS

Modern Dictionary of Electronics, Sixth edition, Rudolf & Graf, 1992, ISBN 0-672-22041-5, p. 640.

*Primary Examiner*—Peter S. Wong
*Assistant Examiner*—Shawn Riley
*Attorney, Agent, or Firm*—Foley & Lardner

[57] ABSTRACT

The present invention provides an apparatus for altering an electrical signal between a first device and a second device. The apparatus includes a support structure or interconnection member having at least two surfaces with a plurality of contacts on each surface. The contacts are arranged in a predesignated pattern to mate with the conductors of each of the devices. In a typical application, the apparatus will be used to connect a microprocessor powered by approximately 3.3 V to a printed circuit board of a system using a power supply of approximately 5.0 V.

20 Claims, 3 Drawing Sheets

5,546,297

APPARATUS FOR MODIFYING AN ELECTRICAL SIGNAL

This is a Continuation of application Ser. No. 08/114,469 filed Aug. 31, 1993 abandoned.

TECHNICAL FIELD

This invention relates to an apparatus for modifying an electrical signal passing between first and second devices, and particularly to an apparatus for regulating a voltage signal between two electrical components, such as a microprocessor and a printed circuit board to which the microprocessor is mounted. The printed circuit board could, for example, be situated in a device such as a computer.

BACKGROUND OF THE INVENTION

In the electronics industry, and particularly in the computer industry, electrical signals are often transmitted between devices or components at a multiplicity of contact points. One example is a microprocessor having a large number of contact pins connected to corresponding contacts on, for instance, a printed circuit board within a computer. Typically, the microprocessor will have a pin grid array appropriately configured for mating engagement with corresponding contacts arranged in some type of socket or receptacle.

Generally, standard voltages are used to power various electrical components, such as microprocessors. For example, computers generally use a supply voltage of approximately 5.0 V to power various digital hardware devices. In certain applications, this can be problematic because heat is generated when current is supplied at 5.0 V. As electrical devices are continually downsized, such heat generation becomes a greater problem. In certain applications, microprocessors must be packaged in ceramic pin grid array packages which can withstand the heat. Cheaper plastic packages may melt or be otherwise damaged by excess heat. Ceramic packaging is more expensive to manufacture than plastic packaging, leading to increased cost of the finished product.

Certain electrical components are presently available which can be powered by 3.3 V, which creates substantially less heat than higher (e.g., 5.0 V) supply voltages. For example, certain microprocessor chips, such as the Am 486™ 3.3 V manufactured by Advanced Micro Devices, can be powered by 3.3 V and are available in plastic packages called plastic quad flat packages. The Am 486™ 3.3 V microprocessor chip is specially designed to allow the core microprocessor to operate at 3.3 V while providing compatible external signals of approximately 5.0 V. This allows the chip to function on about one-half the power of a conventional 5.0 V chip. Such chips or devices are also beneficial since the plastic quad flat package is a much narrower package than the conventional ceramic package. This is particularly advantageous when space is limited.

One problem, of course, is that many devices are powered by the standard 5.0 V power supply and 3.3 V components, such as 3.3 V microprocessors, cannot be used unless the power supply is converted from approximately 5.0 V to approximately 3.3 V. However, creating electrical signal conversion circuitry is generally costly and space consuming. Converting the electrical signal from one level to another is particularly difficult in tight spaces where there are multiple contacts, as with a microprocessor or other digital components.

SUMMARY OF THE INVENTION

The present invention provides an apparatus for coupling a first device with a second device, where the first device effects electrical communications with the second device through a plurality of first conductive connectors. Similarly, the second device effects electrical communications via a plurality of second conductive connectors. An interconnecting member is operably connected between the plurality of first connectors and the plurality of second connectors and includes an altering circuit for altering the electrical communications between the first device and the second device. More specifically, the interconnecting member includes a support member having a first plurality of contacts on a first side and a second plurality of contacts on a second side. The first plurality of contacts and the second plurality of contacts are configured for connection with the first plurality of connectors and second plurality of connectors, respectively. In the most preferred embodiment, the altering circuit includes a voltage regulator which regulates or changes a voltage signal communicated between selected first connectors of the plurality of first connectors and selected second connectors of the plurality of second connectors.

In a specific application of the invention, the support member is a generally rectangular flat member having opposing surfaces generally parallel with each other. The first plurality of contacts are disposed in one surface of the flat member and are configured to engage the plurality of first connectors, such as the pins or contacts of a microprocessor chip contained in a plastic quad flat package. The second plurality of contacts are supported in the opposite surface of the flat member and are configured to engage the plurality of second connectors, such as sockets on a printed circuit board. The altering circuit, preferably including a voltage regulator and a pair of capacitors, is operatively connected between the first plurality of contacts and the second plurality of contacts to reduce the voltage supplied at the second device to a desired lower voltage for powering the first device, e.g. a microprocessor.

BRIEF DESCRIPTION OF THE DRAWINGS

The invention will hereafter be described with reference to the accompanying drawings, wherein like numerals denote like elements in the various figures, and.

DETAILED DESCRIPTION OF A PREFERRED EMBODIMENT

Figure 1:
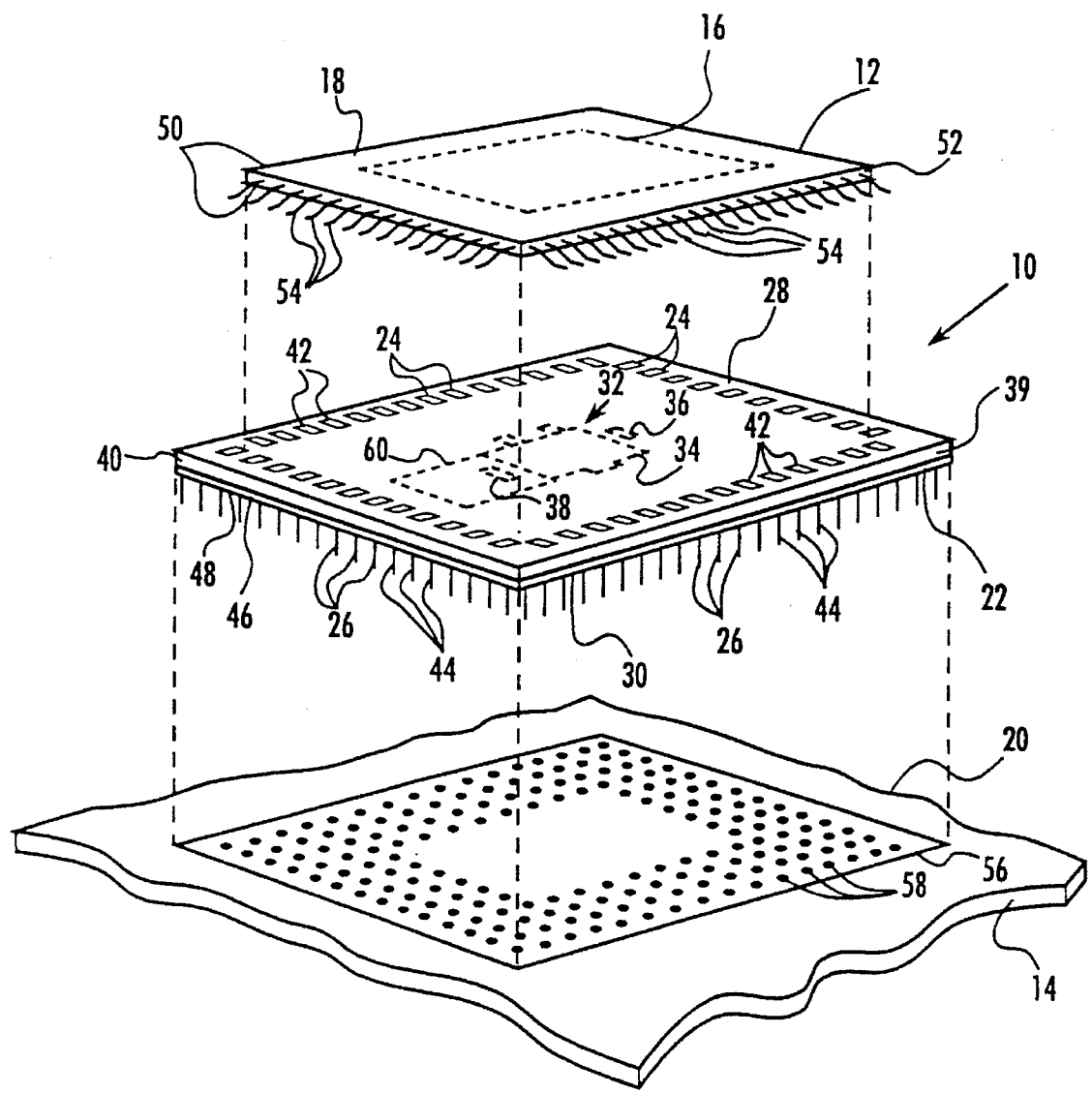
FIG. 1 is an exploded view of the preferred embodiment of the present invention disposed between a first device and a second device.

FIG. 1 is an exploded view of a preferred embodiment of the present invention disposed between a first device and a second device. In FIG. 1, an apparatus 10 disposed between a first device 12 and a second device 14. Apparatus 10 can be made in a variety of shapes and configurations and can be used to conduct electrical signals between a variety of different types of devices, 12, 14. However, in the following description, apparatus 10 will be described in a configuration for use between a first device 12, such as a microprocessor 16 housed in a plastic quad flat package 18, and a circuit board 20 of the type used in a computer or any of a variety of electrical devices. It should also be noted that apparatus 10 could be used to alter a variety of electrical communications or electrical signal characteristics, but for exemplary purposes in this description, apparatus 10 will be described as altering a voltage supplied from second device 14 to first device 12.

Apparatus 10 includes an interconnection member 22 which can take a variety of forms or shapes depending on the specific application and the specific devices 12, 14 that are used. Interconnection member 22 includes a plurality of first contacts 24 and a plurality of second contacts 26. Preferably, first contacts 24 are supported in a first surface 28 and second contacts 26 are supported in a second surface 30. First surface 28 and second surface 30 may also be formed in a variety of configurations and orientations, but in the exemplary embodiment being described, they are generally parallel to one another and closely spaced. Both first contacts 24 and second contacts 26 are arranged in predetermined configurations for mating engagement with first device 12 and second device 14, respectively.

Apparatus 10 also includes an electric signal altering device 32, preferably including electrical circuitry for altering the electrical signal between second device 14 and first device 12. Altering device 32 is interconnected between at least a portion of first contacts 24 and at least a portion of second contacts 26 so that the electrical signal being communicated between second device 14 and first device 12 is appropriately altered. In the illustrated embodiment, altering device 32 includes a voltage regulator 34, such as the MC33269 low dropout positive voltage regulator manufactured by Motorola, Inc., of Schaumburg, Ill. In addition, altering circuit 32 preferably includes a first capacitor 36 operatively connected intermediate voltage regulator 34 and the selected portion of first contacts 24. Altering circuit 32 also includes a second capacitor 38 operatively connected intermediate voltage regulator 34 and the corresponding selected portion of second contacts 26. First capacitor 36 and second capacitor 38 must be selected according to the particular application. However, when used with the Motorola MC33269 voltage regulator to reduce voltage from approximately 5.0 V to approximately 3.3 V, first capacitor 36 is preferably a ten microfarad capacitor, such as the capacitor having part number T 411B106M025AS manufactured by Kemet Electronics Corporation of Greenville, S.C., and second capacitor 38 is a 0.1 microfarad capacitor, such as the capacitor having part number C 0805A 104K5XAC manufactured by Kemet Electronics Corporation.

In the most preferred embodiment, interconnection member 22 includes a thin support member 39, preferably rectangular and having an edge 40 extending about its perimeter and separating first surface 28 from second surface 30. Support member 39 may be made from a variety of insulative type materials, including plastic. Although FIG. 1 illustrates support member 39 as a generally solid structure, member 39 could also include apertures, a hollow interior, or its first and second surfaces 28, 30 could be held in a spaced relation by a variety of internal support structures.

Additionally, first contacts 24 are preferably supported in first surface 28 and can take a variety of configurations. For example, the contacts could be sockets, pins, or pads depending on the type of connectors used on first device 12. In fact, first device 12 could even be hard-wired to contacts 24, although it is preferably surface mounted to pads 42 supported in or arrayed on first surface 28 of support member 39. Similarly, the plurality of second contacts 26 can take a variety of configurations including sockets, pins, pads, or direct hardwiring depending on the type of second device 14. In the most preferred embodiment, second contacts 26 are pins appropriately arranged in an array for plugging into second device 14, e.g. a socket on a printed circuit board. Pins 44 may be attached directly to support member 39 or may be purchased as a prearranged pin grid array package 46 having a plastic base 48 for rigidly holding pins 44 in the appropriate predetermined pattern for interconnection with second device 14. Pin grid array package 46 is then mounted to support member 39 by any of a variety of methods, such as surface mounting. Pins 44 of package 46 may be surface mounted to corresponding pads on support member 39.

As mentioned above, first device 12 may be of a variety of types, but for purposes of this detailed description, the microprocessor 16 encapsulated in plastic quad flat package 18 will be described. One great advantage of this invention is that it can be used with microprocessor chips such as the Am 486™ 3.3 V chip packaged in a plastic quad flat package to present a space-conserving package. In this instance, first device 12 includes the generally flat package 18 having a pair of generally parallel surfaces 50 separated by an edge 52. A plurality of conductive connectors 54 are operatively connected (not shown) to microprocessor chip 16 and extend from edge 52 in an arrangement corresponding to the array of first contacts 24. Thus, connectors 54 may be surface mounted to pads 42 when first device 12 is operatively engaged with apparatus 10. The mounting methods will vary depending on the device, but surface mounting is preferred using attachment mechanisms such as solder or epoxy.

Similarly, second device 14 may be of a variety of types and configurations but will typically include some type of circuit board 20 having a mounting area or socket 56 configured for receiving apparatus 10. Mounting area 56 will include a plurality of second conductive connectors 58 configured and arranged to receive the plurality of second contacts 26. In the illustrated embodiment, second conductive connectors 58 are sockets arranged to receive pins 44.

Optionally, apparatus 10 may include a heat sink 60. Heat sink 60 may include a variety of large traces, bars, or fins arranged within or adjacent interconnection member 22 and extending into proximity or into contact with electric signal altering device 32. Heat sink 60 assists in dispersing any heat produced by altering device 32 as it modifies or alters an electric signal communicated between second device 14 and first device 12.

Figure 2:
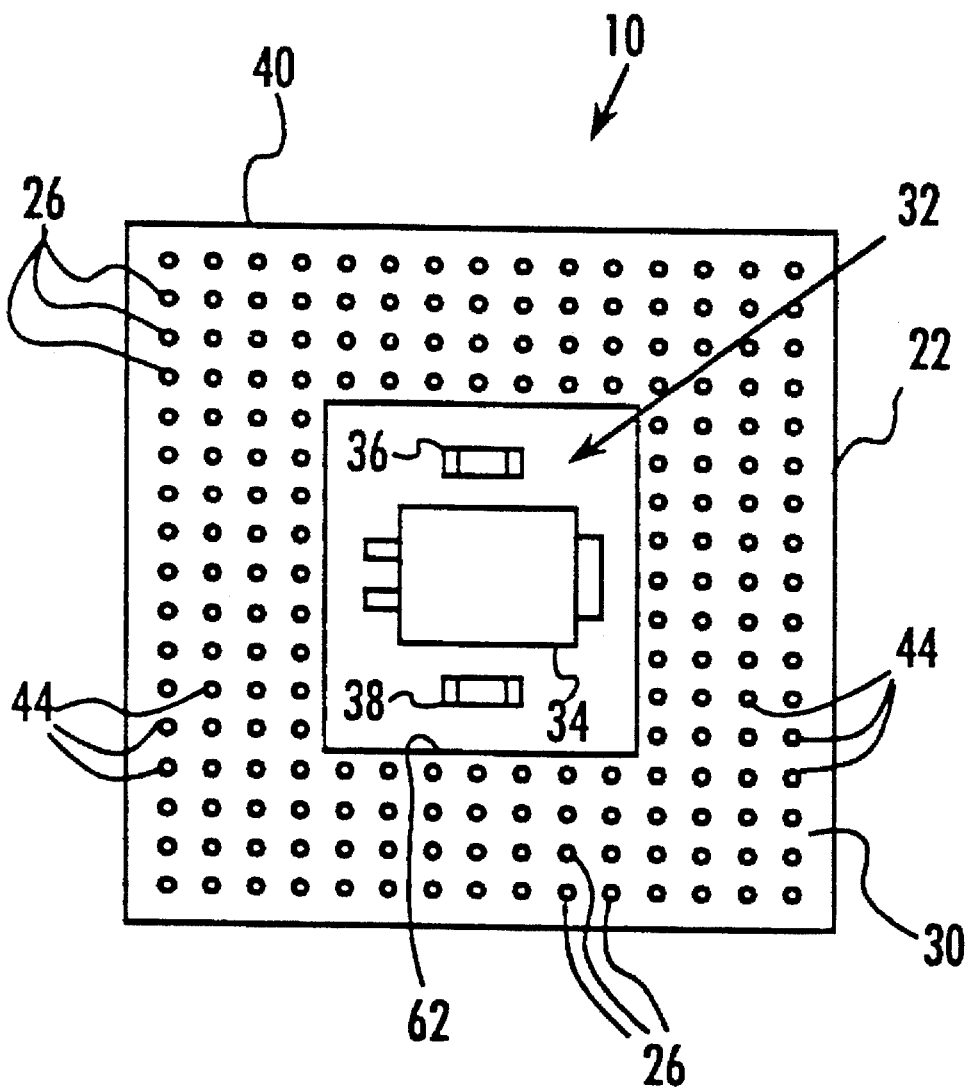
FIG. 2 is a bottom view of the preferred embodiment of the present invention.

FIG. 2 is a bottom view of the preferred embodiment of the present invention. In FIG. 2, components of altering device 32, such as voltage regulator 34 and capacitors 36 and 38 are mounted to interconnection member 22 in a generally central location to accommodate the predetermined array of pins 44. Preferably interconnection member 22 includes a recess 62 for at least partially receiving voltage regulator 34 and capacitors 36 and 38. Recess 62 allows for a thinner apparatus 10 so that first device 12 and second device 14 may be connected in a space efficient manner. Voltage regulator 34 and capacitors 36, 38 are preferably surface mounted to selected first contacts 24 and selected second contacts 26 in a manner more clearly illustrated by the circuit diagram in FIG. 3.

Figure 3:
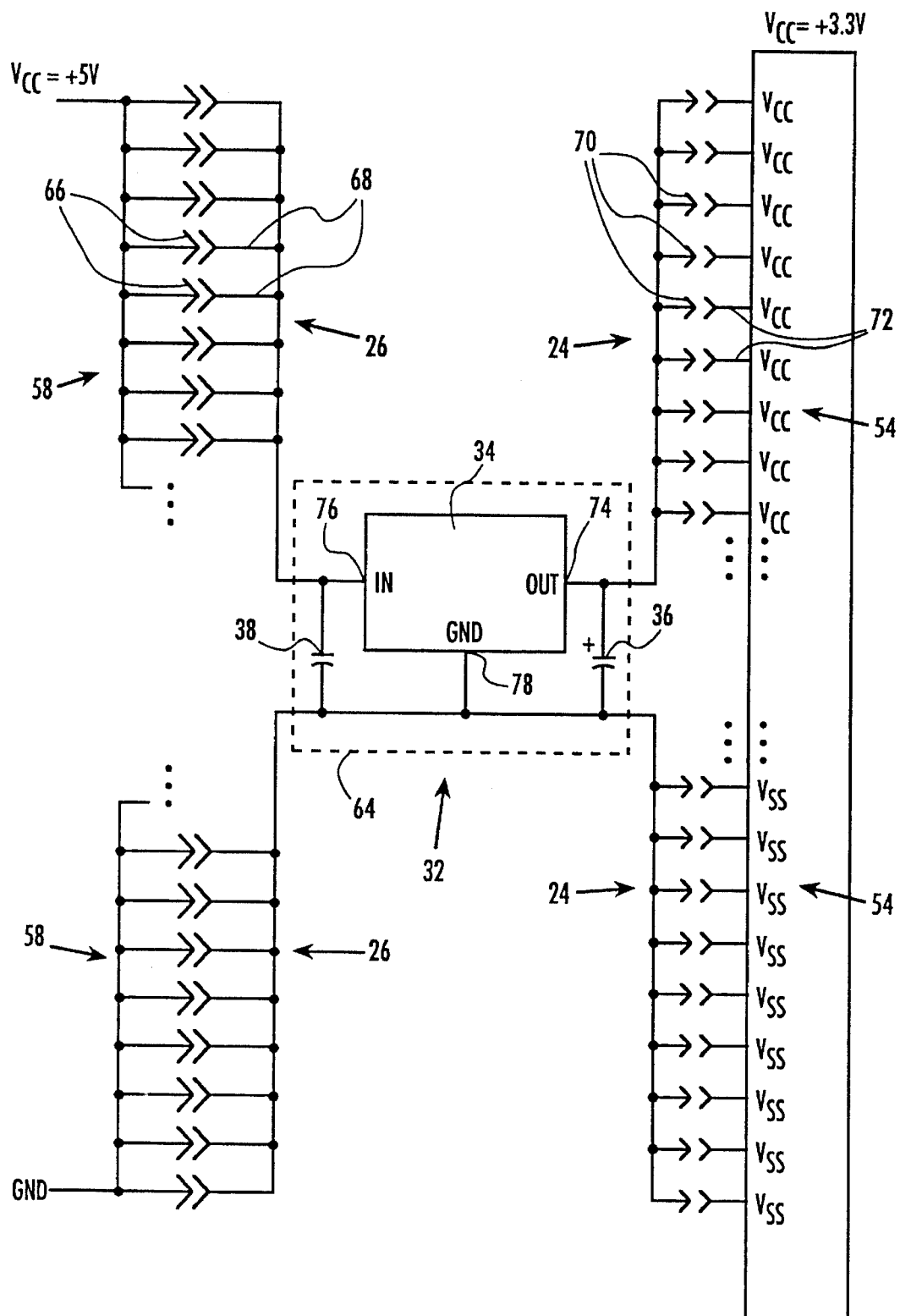
FIG. 3 is an electrical schematic diagram of a circuit for altering an electrical signal between a first device and a second device.

FIG. 3 is an electrical schematic diagram of a circuit for altering an electrical signal communicated between a first device and a second device. In FIG. 3, an electrical signal, such as a 5.0 V signal is supplied at selected connectors 66 of second connectors 58. The electrical signal at connectors 66 is then supplied to selected second contacts 68 of second contacts 26 and to altering circuit 64 which modifies or alters the signal. In this particular exemplary case, altering circuit 64 changes the original electrical signal supplied at selected connectors 66 from approximately 5.0 V to an altered electrical signal. The altered electrical signal has a value of approximately 3.3 V. The altered electrical signal is then supplied to selected first contacts 70 of first contacts 24 and corresponding selected connectors 72 of the first connectors 54 located on first device 12. It should be noted that in the typical situation the main electrical supply signal of 5.0 V is not supplied at every connector 58 of second device 14 to be received by every connector 54 of first device 12. For instance, there may be a variety of signals including 5.0 V signals, ground signals, and logic signals. Only selected conductors 66 and 72 carry the 5.0V supply signal. The remaining second connectors 58 and first connectors 54 may be connected in appropriate corresponding relationship to facilitate operation of the microprocessor 16, but electrical signals communicated therebetween are not altered by altering circuit 64.

As illustrated in FIG. 3, altering circuit 64 includes voltage regulator 34 connected intermediate selected contacts 68 and 70. First capacitor 36 is operably connected intermediate an output terminal 74 of voltage regulator 34 and first selected contacts 70. Second capacitor 38 is connected intermediate second selected contact 68 and an input terminal 76 of voltage regulator 34. As illustrated, both first capacitor 36 and second capacitor 38 are also connected to a ground terminal 78 of voltage regulator 34. Thus, in operation the original electrical signal supplied at approximately 5.0 V to selected conductors 66 is reduced by altering circuit 64 to approximately a 3.3 V electric signal at selected conductors 72 of first device 12. This allows a lower cost microprocessor chip packaged in a plastic quad flat package (PQFP) and powered by a 3.3 V supply, to be used with conventional 5.0 V systems. Such 3.3 V microprocessors use less energy and generate less heat than 5.0 V microprocessors, allowing them to be packaged in less expensive plastic.

It will be understood that the foregoing description is of a preferred exemplary embodiment of this invention, and that the invention is not limited to the specific form shown. For example, the interconnection member may be made in a variety of configurations and manufactured from a variety of materials. The contacts may also be made in a variety of configurations, the circuitry can be adapted to alter electrical signals in ways other than reduction in voltage, and the apparatus may be used to interconnect a variety of devices which function using dissimilar electrical signals. These and other modifications may be made in the design and arrangement of the elements without departing from the scope of the invention as expressed in the appended claims.

What is claimed is:

1. An interconnection member for use in an electrical circuit including an integrated circuit package and a circuit board, the integrated circuit package including a plurality of package contacts arranged in a first pattern, the circuit board including a plurality of board contacts arranged in a second pattern, the package contacts including a plurality of package power contacts for receiving a first power signal at a first voltage level, the board contacts including a plurality of board power contacts for providing a second power signal at a second voltage level, the interconnection member comprising:

a first surface having a plurality of first member contacts disposed to be electrically and mechanically coupled to the package contacts, the first member contacts being arranged in the first pattern;

a second surface opposite the first surface having a plurality of second member contacts disposed to be electrically and mechanically coupled to the package contacts, the second member contacts being arranged in the second pattern; and a semiconductor, active voltage regulator electrically coupled between the first member contacts and the second member contacts for changing the second power signal at the second voltage level from the board power contacts to the first power signal at the first voltage level and providing the first power signal to the package power contacts.

2. The interconnection member of claim 1 wherein the first voltage level is less than the second voltage level.

3. The interconnection member of claim 2 wherein the first voltage level is 3.3 V and the second voltage level is 5 V.

4. The interconnection member of claim 1 wherein the second pattern is a grid array pattern.

5. The interconnection member of claim 4 wherein the board contacts are sockets and the package contacts are surface mount contacts.

6. The interconnection member of claim 5 wherein the first member contacts are surface mount contacts and the second member contacts are pins.

7. The interconnection member of claim 1 wherein the integrated circuit package is a rectangular, plastic package containing a semiconductor die.

8. An interconnection system for use in an electrical circuit, the circuit including a circuit board, the circuit board including a plurality of sockets arranged in a second pattern, the board sockets including a plurality of board power contacts for providing a second power signal at a second voltage level, the interconnection system comprising:

a single processor semiconductor die integrated in a single flat package, the flat package including a plurality of package contacts arranged in a first pattern about a package periphery of the flat package, the package contacts including a plurality of package power contacts for receiving a first signal at a first voltage level;

a first surface having a plurality of first member contacts disposed to be electrically coupled to the package contacts of the single flat package, the first member contacts being arranged in the first pattern about a surface periphery of the first surface, the package periphery being substantially the same as the surface periphery;

a second surface opposite the first surface having a plurality of second member contacts disposed to be electrically coupled to the package contacts, the second member contacts being arranged in the second pattern, the second pattern having a pin-for-pin relationship with the second pattern; and a semiconductor, active voltage regulator means, electrically coupled between a set of the first member contacts associated with the package power contacts and a corresponding set of the second member contacts associated with the board power contacts, for receiving the second power signal at the second voltage level from the board power contacts and for providing the first power signal at the first voltage level and providing the first power signal to the package power contacts.

9. The interconnection member of claim 8 further comprising an insulative support member located between the first and second surface.

10. The interconnection system of claim 9 wherein the voltage regulator means is disposed in a cavity in the insulative support member.

11. The interconnection system of claim 8 wherein the first voltage level is 3.3 V and the second voltage level is 5 V.

12. The interconnection system of claim 8 wherein the pattern is a pin ball grid array pattern.

13. The interconnection system of claim 12 wherein the package contacts are surface mount contacts.

14. The interconnection system of claim 8 wherein the first member contacts are surface mount contacts and the second member contacts are pins.

15. The interconnection system of claim 8 wherein the voltage regulator means includes a capacitor.

16. An interconnection system for electrically and mechanically coupling an integrated circuit package to a circuit board, the interconnection system comprising:

an insulative support member;

a plurality of surface mount contacts disposed on a first surface of the support member;

a plurality of pins disposed on a second surface of the support member, each of the pins corresponding to a respective contact of the support member contacts; and a semiconductor, active power regulator coupled between a plurality of power pins of the pins and a plurality of respective power contacts of the contacts, the power regulator stepping down a first power signal received at the power pins to a lower level and providing a second power signal at the lower level at the respective power contacts.

17. The interconnection system of claim 16 wherein the support member is rectangular.

18. The interconnection system of claim 16 wherein the insulative member includes a recess for housing the regulator.

19. The interconnection system of claim 17 wherein the surface mount contacts are disposed about a periphery of the insulative support member.

20. The interconnection member of claim 1 wherein the semiconductor, active voltage regulator includes a capacitor.

* * * * *